(12) United States Patent
Hozumi

(10) Patent No.: US 9,414,492 B2
(45) Date of Patent: Aug. 9, 2016

(54) PRINTED WIRING BOARD AND ELECTRIC TOOL SWITCH PROVIDED THEREWITH

(71) Applicant: OMRON CORPORATION, Kyoto-shi (JP)

(72) Inventor: Akihiro Hozumi, Okayama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/311,966

(22) Filed: Jun. 23, 2014

(65) Prior Publication Data
US 2015/0014043 A1  Jan. 15, 2015

(30) Foreign Application Priority Data

Jul. 11, 2013  (JP) ................................. 2013-145828

(51) Int. Cl.
*H05K 1/11* (2006.01)
*H05K 3/34* (2006.01)

(52) U.S. Cl.
CPC .............. *H05K 1/116* (2013.01); *H05K 3/3447* (2013.01); *H05K 3/3452* (2013.01); *H05K 2201/0999* (2013.01); *H05K 2201/09627* (2013.01); *H05K 2201/09781* (2013.01); *H05K 2201/2045* (2013.01)

(58) Field of Classification Search
CPC ... H05K 1/116; H05K 3/3447; H05K 3/3452; H05K 2201/09627; H05K 2201/09781; H05K 2207/0999; H05K 2201/2045
USPC .......................................................... 174/263
See application file for complete search history.

(56) References Cited

U.S. PATENT DOCUMENTS

| 2003/0196831 | A1* | 10/2003 | Momokawa | ......... | H05K 3/3447 174/251 |
| 2007/0080465 | A1* | 4/2007 | Ebukuro | ................ | H05K 1/116 257/774 |
| 2009/0219045 | A1 | 9/2009 | Carney | | |

FOREIGN PATENT DOCUMENTS

| JP | H07283500 A | 10/1995 |
| JP | 2012094681 | 5/2012 |
| WO | 0197577 A1 | 12/2001 |

OTHER PUBLICATIONS

Extended European Search Report for corresponding application EP 14 17 3637; Report Dated Nov. 20, 2014.

* cited by examiner

*Primary Examiner* — Timothy Thompson
*Assistant Examiner* — Paul McGee, III
(74) *Attorney, Agent, or Firm* — Klarquist Sparkman, LLP

(57) ABSTRACT

A printed wiring board including a connection part that is connected to a projecting portion of an external member by soldering, the connection part including a first hole in which the projecting portion is inserted, a main land to which the projecting portion is soldered, a metallic pattern that is drawn from the main land, and a sub-land that is connected to the main land through the metallic pattern, wherein the main land is constructed with a metallic film configured to cover a peripheral region of the first hole in at least a front face of the printed wiring board including the front face and a back face, the front face to which the soldering is performed and the back face on a side opposite to the front face, and the metallic film is not formed on a sidewall forming the first hole, and where the sub-land is constructed with a metallic film configured to cover a sidewall formed by a second hole piercing the printed wiring board and a peripheral region of the second hole in both the front face and the back face of the printed wiring board.

13 Claims, 4 Drawing Sheets

PRIOR ART

FIG. 6A
PRIOR ART
FIG. 6B
PRIOR ART
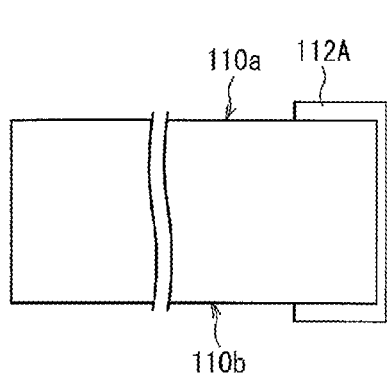
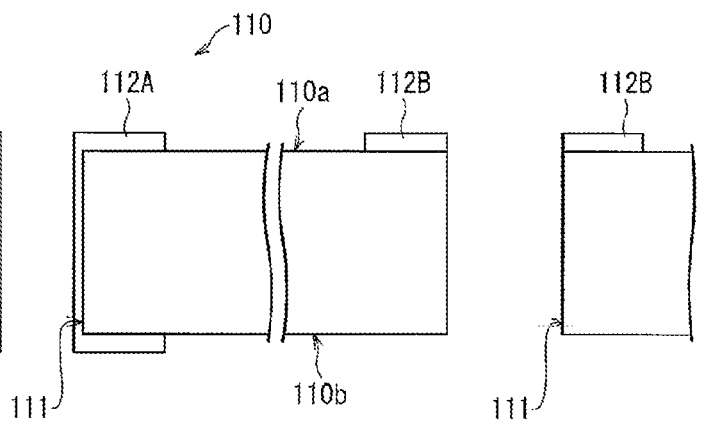

PRINTED WIRING BOARD AND ELECTRIC TOOL SWITCH PROVIDED THEREWITH

CROSS REFERENCE TO RELATED APPLICATION

This application is related to and claims the benefit of Japanese Patent Application Number 2013-145828 filed on 11 Jul. 2013, the contents of which are herein incorporated by reference in their entirety.

BACKGROUND

1. Field

The present invention relates to a printed wiring board and an electric tool switch provided therewith.

2. Related Art

In order to mount or attach various components, a soldering land is provided in a printed wiring board while exposed on a front face of the printed wiring board. Particularly, the printed wiring board used in an electric tool switch is connected to a constituent member (for example, casing member formed by sheet metal working) constituting the electric tool switch by soldering. FIG. 5 is a perspective view schematically illustrating a connection portion between printed wiring board 110 and constituent member 120 in the electric tool switch. As illustrated in FIG. 5, projecting portion 121 is provided in constituent member 120. Hole 111 in which projecting portion 121 is inserted is made in printed wiring board 110. Soldering land 112 to which projecting portion 121 is soldered is provided on a front face of printed wiring board 110 so as to surround hole 111. Soldering land 112 is a film made of metal. In the electric tool switch, a contact mechanism that turns on and off a switch is arranged on a side opposite to the soldering front face of printed wiring board 110.

FIGS. 6A and 6B are sectional views illustrating a configuration of a conventional soldering land, in which FIG. 6A illustrates a configuration of a through-hole land, and FIG. 6B illustrates a configuration of a single-sided land.

As illustrated in FIG. 6A, a metallic film constituting through-hole land 112A extends from front face 110a of printed wiring board 110 to back face 110b of printed wiring board 110 through a sidewall constituting hole 111. On the other hand, a metallic film constituting single-sided land 112B is formed only on front face 110a of printed wiring board 110.

Japanese Unexamined Patent Publication No. 2012-94681 discloses a technology in which an end portion of the land is held by a paint printed by silkscreen in order to prevent the metallic film constituting the land from peeling from the printed wiring board.

In the electric tool switch including the configuration in FIG. 5, a vibration is transmitted to the connection portion between printed wiring board 110 and constituent member 120 during switch operation. Therefore, it is necessary for the connection portion between printed wiring board 110 and constituent member 120 to secure a strength to a degree that a wiring pattern of printed wiring board 110 does not peel against the vibration. Similarly, in soldering projecting portion 121, it is necessary to prevent a flux generated by the soldering from extending onto a back face side of the printed wiring board. A conduction failure is generated when the flux generated by the soldering adheres to the contact mechanism provided on the side opposite to the soldering front face of printed wiring board 110.

However, in the configuration of the conventional land in FIGS. 6A and 6B, it is difficult to satisfy both the securement of the peeling strength against the vibration in the wiring pattern of the printed wiring board and the prevention of the flux from extending onto the back face side of the printed wiring board.

In the configuration of through-hole land 112A in FIG. 6A, the peeling strength of the wiring pattern is enhanced because the metallic film constituting through-hole land 112A extends to back face 110b of printed wiring board 110 through the sidewall constituting hole 111. However, when the soldering is performed to through-hole land 112A, a solder material moves easily into hole 111 because the metallic film is formed on the sidewall constituting hole 111. Therefore, the flux generated by the soldering cannot be prevented from extending onto back face 110b of the printed wiring board.

In the configuration of single-sided land 112B in FIG. 6B, the metallic film is not formed on the sidewall constituting hole 111, but an insulating material is exposed on the sidewall. When the soldering is performed to single-sided land 112B, the solder material remains in the metallic film formed on front face 110a of printed wiring board 110, and hardly moves to back face 110b of printed wiring board 110 through the sidewall constituting hole 111. Therefore, the flux hardly extends onto the side of back face 110b of printed wiring board 110. However, the peeling strength of the wiring pattern is weakened because the metallic film does not extend to back face 110b of printed wiring board 110 through the sidewall constituting hole 111.

In the case that the technology disclosed in Japanese Unexamined Patent Publication No. 2012-94681 is applied in order to enhance the peeling strength of the wiring pattern of printed wiring board 110, it is necessary to perform a process of holding the end portion of the land by the paint printed by the silkscreen. Therefore, unfortunately a production process becomes complicated.

SUMMARY

The invention provides a printed wiring board that satisfies both the securement of the peeling strength against the vibration in the wiring pattern of the printed wiring board and the prevention of the flux from extending onto the back face side of the printed wiring board, and an electric tool switch provided with the printed wiring board.

More particularly, in one embodiment, a printed wiring board is provided including a connection part that is connected to a projecting portion of an external member by soldering, the connection part including a first hole in which the projecting portion is inserted, a main land to which the projecting portion is soldered, a metallic pattern that is drawn from the main land, and a sub-land that is connected to the main land through the metallic pattern, wherein the main land is constructed with a metallic film configured to cover a peripheral region of the first hole in at least a front face of the printed wiring board including the front face and a back face, the front face to which the soldering is performed and the back face on a side opposite to the front face, and the metallic film is not formed on a sidewall forming the first hole, and where the sub-land is constructed with a metallic film configured to cover a sidewall formed by a second hole piercing the printed wiring board and a peripheral region of the second hole in both the front face and the back face of the printed wiring board.

BRIEF DESCRIPTION OF THE DRAWINGS

FIGS. 1A to 1C illustrate a configuration around a connection part for connecting with a constituent member constituting an electric tool switch in a printed wiring board according to a first embodiment of the present invention, in which FIG. 1A is a sectional view, FIG. 1B is a plan view as seen from a front face side, and FIG. 1C is a plan view as seen from a back face side;

FIGS. 6A and 6B are sectional views illustrating a configuration of a conventional soldering land, in which FIG. 6A illustrates a configuration of a through-hole land, and FIG. 6B illustrates a configuration of a single-sided land.

DETAILED DESCRIPTION

Figure 1A:
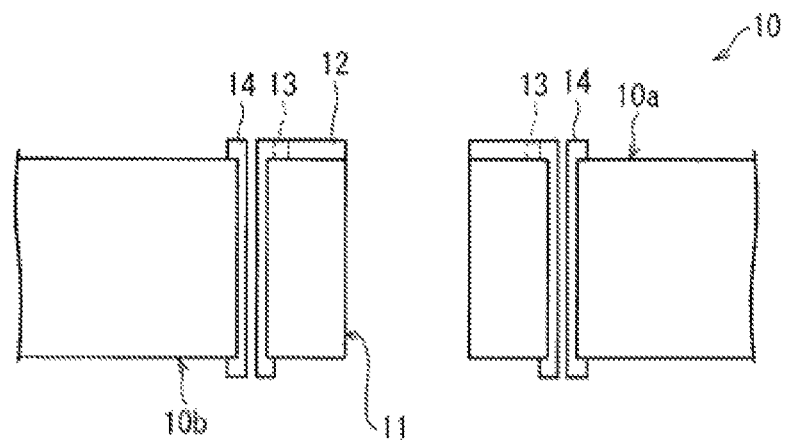
Figure 1B:
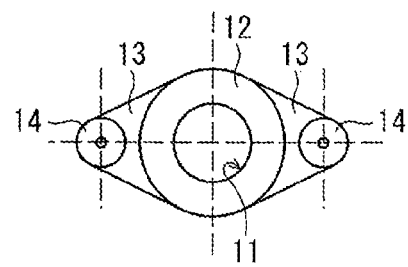
Figure 1C:
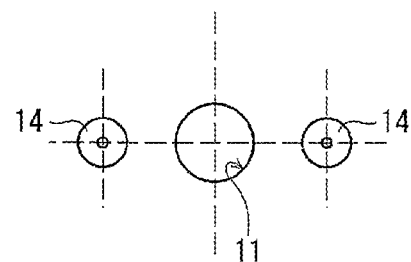

A first embodiment of the present invention will be described below with reference to FIG. 1. FIGS. 1A to 1C illustrate a configuration around connection part 10A for connecting with a constituent member constituting an electric tool switch in a printed wiring board 10 of the first embodiment. FIG. 1A is a sectional view, FIG. 1B is a plan view as seen from a side of front face 10a, and FIG. 1C is a plan view as seen from a side of back face 10b.

Connection part 10A in FIGS. 1A to 1C is a portion that is to be connected to a projecting portion of the constituent member (the external member) in printed wiring board 10 by soldering. Connection part 10A includes hole 11 (a first hole), soldering land 12 (a main land), lead pattern 13 (a metallic pattern), and micro-hole through-hole land 14 (a sub-land).

The projecting portion provided in the constituent member is inserted in hole 11. The projecting portion inserted in hole 11 is soldered to printed wiring board 10 at soldering land 12 which is constructed by a metallic film. The metallic film constructing soldering land 12 is formed on front face 10a of printed wiring board 10 so as to surround a periphery of hole 11.

Lead pattern 13 is constructed with a metallic film, and lead pattern 13 is drawn from soldering land 12 on both front face 10a and back face 10b of printed wiring board 10. As illustrated in FIG. 1B, lead pattern 13 is drawn from soldering land 12 in two directions on front face 10a of printed wiring board 10.

A micro hole (a second hole) piercing printed wiring board 10 is made near hole 11 of printed wiring board 10. Micro-hole through-hole land 14 is a metallic film that is formed in a peripheral region of the micro hole in front face 10a, a sidewall forming the micro hole, and a peripheral region of the micro hole in back face 10b. Micro-hole through-hole land 14 is coupled to soldering land 12 through lead pattern 13 on both front face 10a and back face 10b of printed wiring board 10. Micro-hole through-hole land 14 acts not as land for soldering but as a metallic bridge connecting front face 10a and back face 10b of printed wiring board 10. Even if the micro hole of micro-hole through-hole land 14 is filled with a metallic material, a peeling strength of a wiring pattern can be enhanced. However, in this case, it is necessary to perform a process of filling the micro hole with the metallic material.

As illustrated in FIGS. 1B and 1C, micro-hole through-hole lands 14 are formed at two places while soldering land 12 is sandwiched therebetween. The formation places of micro-hole through-hole lands 14 are line-symmetrically located with respect to the center of hole 11.

At this point, as illustrated in FIGS. 1A to 1C, soldering land 12 includes the same configuration as the single-sided land. The metallic film constituting soldering land 12 is formed only on front face 10a of printed wiring board 10. The metallic film is not formed on the sidewall forming hole 11 nor on back face 10b of printed wiring board 10 such that an insulating material is exposed. In the case that the soldering is performed to soldering land 12, the solder material remains in the metallic film formed on front face 10a, and hardly moves to back face 10b through the sidewall forming hole 11. Therefore, a flux hardly extends onto the side of back face 10b of printed wiring board 10.

In the first embodiment, lead pattern 13 is not formed on back face 10b of printed wiring board 10, but is instead formed on front face 10a. Micro-hole through-hole land 14 is coupled to soldering land 12 through lead pattern 13 formed on front face 10a.

Because soldering land 12 is the single-sided land that is constructed with the metallic film formed only on front face 10a of printed wiring board 10, soldering land 12 has the relatively weak peeling strength. To address the problem, the land structure of printed wiring board 10 of the first embodiment includes a through-hole connection land structure in which soldering land 12 and micro-hole through-hole land 14 are connected to each other through lead pattern 13 on front face 10a.

Therefore, the peeling strength of soldering land 12 is reinforced by micro-hole through-hole land 14. In printed wiring board 10 of the first embodiment, micro-hole through-hole land 14 is provided, so that the peeling strength of the wiring pattern can be enhanced compared with the conventional single-sided land. Accordingly, the peeling strength against the vibration during the operation of the electric tool switch can be secured in the wiring pattern of the printed wiring board 10.

As described above, both the securement of the peeling strength against the vibration in the wiring pattern of the printed wiring board 10 and the prevention of the flux from extending onto the side of back face 10b of printed wiring board 10 can be satisfied in printed wiring board 10 of the first embodiment.

In the configuration in FIG. 1, soldering land 12 is formed only on front face 10a of printed wiring board 10. However, in the first embodiment, it is sufficient that the metallic film constituting soldering land 12 be formed so as to cover the peripheral region of hole 11 in at least one of front face 10a and back face 10b of the printed wiring board 10, and it is sufficient that the metallic film is not formed on the sidewall forming hole 11. Therefore, instead of the configuration in FIG. 1, the metallic film constituting soldering land 12 may be formed on both front face 10a and back face 10b of the printed wiring board 10.

In the case that the metallic film constituting soldering land 12 is formed on back face 10b of printed wiring board 10, preferably soldering land 12 is connected to micro-hole through-hole land 14 through lead pattern 13 formed on back face 10b. In this configuration, the peeling strength of the wiring pattern can further be enhanced in printed wiring board 10.

In printed wiring board 10 of the first embodiment, soldering land 12 and micro-hole through-hole land 14 can be produced through the same process. First, hole 11 and the micro hole are made at predetermined positions of printed wiring board 10. Then the metallic film is formed on hole 11 and the micro hole by well-known metal evaporation technique or metal plating technique.

Through the above production procedure, soldering land 12 and micro-hole through-hole land 14 can simultaneously be formed, and reinforcing micro-hole through-hole land 14 can easily be formed.

A dimension of the micro hole in micro-hole through-hole land 14 can properly be set according to a component including printed wiring board 10. Preferably, the dimension of the micro hole is smaller than that of hole 11. Particularly preferably, the micro hole has a dimension of a degree that the flux generated during the soldering does not reach back face 10b due to a surface tension on the sidewall of the micro hole (the flux remains in the sidewall of the micro hole or front face 10a).

Because micro-hole through-hole land 14 is formed in order to reinforce the peeling strength of the wiring pattern of printed wiring board 10, micro-hole through-hole land 14 is not electrically connected to a circuit (wiring pattern) formed on back face 10b of printed wiring board 10, and electrically independent of the circuit. That is, in printed wiring board 10, micro-hole through-hole land 14 is not used to electrically connect the wiring pattern formed on front face 10a and the wiring pattern formed on back face 10b.

Figure 2A:
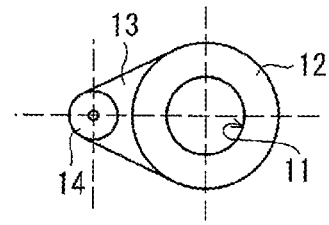
FIGS. 2A and 2B are plan views illustrating examples of the number of micro-hole through-hole lands and a formation place of the micro-hole through-hole land in the printed wiring board of the first embodiment.
Figure 2B:
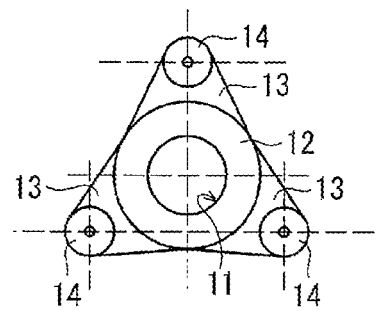

In the configuration in FIGS. 1A to 1C, two micro-hole through-hole lands 14 are formed while soldering land 12 is sandwiched therebetween, and the formation places of micro-hole through-hole lands 14 are line-symmetrically located with respect to the center of hole 11. However, the number of micro-hole through-hole lands 14 and the formation place of micro-hole through-hole land 14 are not limited to those in the configuration in FIGS. 1A to 1C as long as the number of micro-hole through-hole lands 14 and the formation place of micro-hole through-hole land 14 are set so as to reinforce hole 12. FIGS. 2A and 2B are plan views (as seen from the side of front face 10a) illustrating examples of the number of micro-hole through-hole lands 14 and the formation place of micro-hole through-hole land 14 in printed wiring board 10 of the first embodiment.

As illustrated in FIG. 2A, one micro-hole through-hole land 14 may be formed near soldering land 12. In the arrangement in FIG. 2A, the peeling strength of soldering land 12 is relatively enhanced at the place (one point) near micro-hole through-hole land 14.

In the arrangement in FIG. 1B, the peeling strength of soldering land 12 is relatively enhanced at the places (two points) near micro-hole through-hole land 14. That is, the peeling strength is enhanced in a direction of a line connecting two micro-hole through-hole lands 14.

As illustrated in FIG. 2B, micro-hole through-hole lands 14 may be formed at three places around soldering land 12. In the arrangement in FIG. 2B, the peeling strength of soldering land 12 is relatively enhanced at the places (three points) near micro-hole through-hole land 14. That is, the peeling strength is enhanced in three directions in the surface of soldering land 12. With increasing number of micro-hole through-hole lands 14 around soldering land 12, the peeling strength of soldering land 12 is enhanced in front face 10a of printed wiring board 10.

The number of micro-hole through-hole lands 14 and the formation place of micro-hole through-hole land 14 can properly be set according to the direction in which the peeling strength is to be enhanced. In the case that the direction in which the peeling strength is to be enhanced is any direction in front face 10a, micro-hole through-hole lands 14 are formed as in the arrangement in FIG. 2B, namely, at the three places around soldering land 12, and preferably micro-hole through-hole lands 14 are arranged such that a triangle connecting the three formation places of micro-hole through-hole lands 14 becomes a regular triangle.

Second and third embodiments of the present invention will be described below with reference to FIGS. 3 and 4. For the sake of convenience, elements having the same function as that of the first embodiment are designated by the same reference numerals, and the descriptions are neglected.

Figure 3:
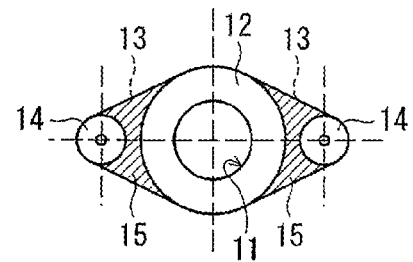
FIG. 3 is a plan view illustrating a configuration around a connection part for connecting with a constituent member constituting an electric tool switch in a printed wiring board according to a second embodiment of the present invention.

FIG. 3 is a plan view illustrating a configuration near a connection part to be connected to a constituent member constituting an electric tool switch in printed wiring board 10 of the second embodiment. As illustrated in FIG. 3, in printed wiring board 10 of the second embodiment, resist film 15 is formed between soldering land 12 and micro-hole through-hole land 14. Resist film 15 is formed in front face 10a of printed wiring board 10 so as to cover lead pattern 13 formed between soldering land 12 and micro-hole through-hole land 14.

The formation of resist film 15 can prevent the solder material from flowing toward micro-hole through-hole land 14 from soldering land 12 during the soldering. Therefore, solder material can remain in soldering land 12 on front face 10a of printed wiring board 10, and diffusion of the solder material can be prevented.

Figure 4:
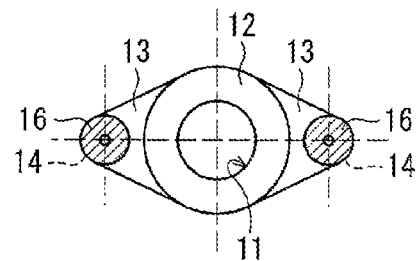
FIG. 4 is a plan view illustrating a configuration around a connection part for connecting with a constituent member constituting an electric tool switch in a printed wiring board according to a third embodiment of the present invention.
Figure 5:
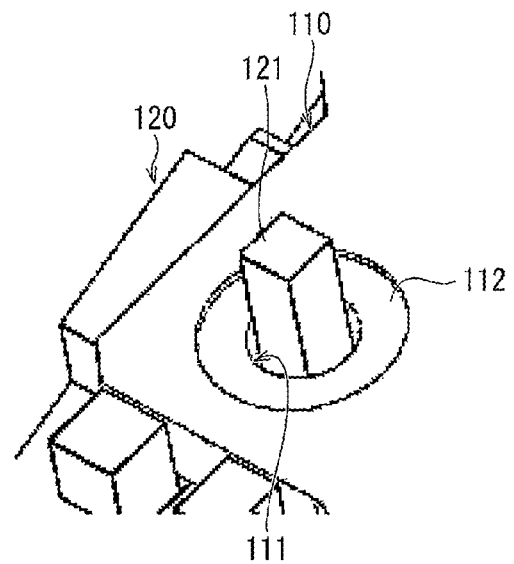
FIG. 5 is a perspective view schematically illustrating a connection portion between a printed wiring board and a constituent member in an electric tool switch.

FIG. 4 is a plan view illustrating a configuration near a connection part to be connected to a constituent member constituting an electric tool switch in printed wiring board 10 of the third embodiment. As illustrated in FIG. 4, printed wiring board 10 may include resist film 16 that covers micro-hole through-hole land 14. The formation of resist film 16 causes the solder material to hardly lie on micro-hole through-hole land 14 on front face 10a of printed wiring board 10. Therefore, the solder material can be prevented from moving to back face 10b of printed wiring board 10 through the micro hole in micro-hole through-hole land 14. The amount of the resist constituting resist film 16 can properly be set according to the dimension of the micro hole as long as the resist does not flow into the side of back face 10b through the micro hole.

The present invention is not limited to the embodiments, but various changes can be made without departing from the scope of the claims. It is noted that an embodiment obtained by a proper combination of technical means disclosed in different embodiments is also included in the technical scope of the present invention.

The present invention can be applied to a switch, particularly to an electric tool switch.

As described by example above, in accordance with one aspect of the present invention, a printed wiring board includes a connection part that is connected to a projecting portion of an external member by soldering. In the printed wiring board, the connection part includes: a first hole in which the projecting portion is inserted; a main land to which the projecting portion is soldered; a metallic pattern that is drawn from the main land; and a sub-land that is connected to the main land through the metallic pattern, the main land is constructed with a metallic film configured to cover a peripheral region of the first hole in at least a front face of the printed wiring board including the front face and a back face, the front face to which the soldering is performed and the back face on a side opposite to the front face, the metallic layer is not formed on a sidewall forming the first hole, and the sub-land is constructed with a metallic film configured to cover a sidewall formed by a second hole piercing the printed wiring board and a peripheral region of the second hole in both the front face and the back face of the printed wiring board.

The insulating material is exposed on the sidewall constituting the first hole because the main land includes the configuration in which the metallic film is not formed on the sidewall. For this reason, when the soldering is performed to the main land, the solder material remains in the metallic film formed on the front face of the printed wiring board, and the solder material hardly moves to the back face of the printed wiring board through the sidewall constituting the first hole. Therefore, the flux hardly extends onto the back face of the printed wiring board.

The main land is constructed with the metallic film covering the peripheral region of the first hole in at least the front face of the printed wiring board including the front face and the back face, but the main land is not formed on the sidewall constituting the first hole. Therefore, the peeling strength is relatively weakened.

To address the problem, according to the configuration of the above exemplary embodiments, the sub-land is constructed with the metallic film configured to cover the sidewall formed by the second hole piercing the printed wiring board and the peripheral region of the second hole in both the front face and the back face of the printed wiring board, and the sub-land includes a through-hole connection land structure in which the main land and the sub-land are connected to each other with the metallic pattern interposed therebetween in the front face of the printed wiring board. Therefore, in the main land, the peeling strength is reinforced by the sub-land. Accordingly, the peeling strength of the wiring pattern can be enhanced compared with the conventional soldering land, because of the sub-land being provided.

In this manner, according to the configuration, both the securement of the peeling strength against the vibration in the wiring pattern of the printed wiring board and the prevention of the flux from extending onto the back face side of the printed wiring board can be satisfied.

In the printed wiring board, preferably a resist film is formed that is configured to cover the metallic pattern provided between the main land and the sub-land.

According to the configuration, the resist film is formed so as to cover the metallic pattern provided between the main land and the sub-land, and the resist film is exposed, so that the solder material can be prevented from flowing toward the sub-land from the main land during the soldering. Accordingly, on the front face of the printed wiring board, the solder material can remain in the main land, and diffusion of the solder material can be prevented.

Preferably, the printed wiring board further includes a resist film configured to cover the sub-land.

According to the configuration, the printed wiring board includes the resist film covering the sub-land, and the resist film is exposed. Therefore, on the front face of the printed wiring board, the solder material hardly lies on the sub-land. Therefore, the solder material can be prevented from moving to the back face of the printed wiring board through the hole in the sub-land.

In the printed wiring board, the sub-land may not be electrically connected to a wiring pattern formed on the back face, and the sub-land may be electrically independent of the wiring pattern. That is, the purpose of providing the sub-land of the present invention is not an electrical connection between the wiring pattern on the front face of the printed wiring board and the wiring pattern on the back face.

In the printed wiring board, preferably the external member is a constituent member constituting an electric tool switch.

In accordance with another aspect of the present invention, an electric tool switch includes the printed wiring board.

Therefore, the peeling strength of the wiring pattern on the printed wiring board can be secured against the vibration during the operation of the electric tool switch.

As described above, in the printed wiring board, the connection part includes: the first hole in which the projecting portion is inserted; the main land to which the projecting portion is soldered; the metallic pattern that is drawn from the main land; and the sub-land that is connected to the main land through the metallic pattern, the main land is constructed with the metallic film configured to cover the peripheral region of the first hole in at least the front face of the printed wiring board including the front face and the back face, the front face to which the soldering is performed and the back face on the side opposite to the front face, and the main land is not formed on the sidewall forming the first hole, and the sub-land is constructed with the metallic film configured to cover the sidewall formed by the second hole piercing the printed wiring board and the peripheral region of the second hole in both the front face and the back face of the printed wiring board.

Therefore, both the securement of the peeling strength against the vibration in the wiring pattern of the printed wiring board and the prevention of the flux from extending onto the back face side of the printed wiring board can advantageously be satisfied.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A printed wiring board comprising:
   a connection part that is connected to a projecting portion of an external member by soldering,
   wherein the connection part comprises:
   a first hole in which the projecting portion is inserted;
   a main land to which the projecting portion is soldered;
   a metallic pattern that is drawn from the main land; and
   a sub-land that is connected to the main land through the metallic pattern,
   wherein the main land is constructed with a metallic film configured to cover a peripheral region of the first hole not in a back face but only in a front face of the printed wiring board comprising the front face and the back face, the front face to which the soldering is performed and the back face being on a side opposite to the front face,
   and the metallic film is not formed on a sidewall forming the first hole, and
   wherein the sub-land is constructed with a metallic film configured to cover a sidewall formed by a second hole piercing the printed wiring board and a peripheral region of the second hole in both the front face and the back face of the printed wiring board
   wherein the sub-land is not electrically connected to a wiring pattern formed on the back face, and the sub-land is electrically independent of the wiring pattern, wherein the wiring pattern is a circuit, the metallic film does not extend from the sidewall forming the first hole to the back face to connect the main land in the front face and the sub-land in the back face.

2. The printed wiring board according to claim 1, wherein a resist film is formed that is configured to cover the metallic pattern provided between the main land and the sub-land.

3. The printed wiring board according to claim 1, further comprising:
a resist film configured to cover the sub-land.

4. The printed wiring board according to claim 1, wherein the external member is a constituent member constituting an electric tool switch.

5. An electric tool switch comprising:
the printed wiring board according to claim 1.

6. The printed wiring board according to claim 2, further comprising: a resist film configured to cover the sub-land.

7. The printed wiring board according to claim 2, wherein the external member is a constituent member constituting an electric tool switch.

8. The printed wiring board according to claim 3, wherein the external member is a constituent member constituting an electric tool switch.

9. The printed wiring board according to claim 1, wherein the external member is a constituent member constituting an electric tool switch.

10. The printed wiring board according to claim 6, wherein the external member is a constituent member constituting an electric tool switch.

11. An electric tool switch comprising:

the printed wiring board according to claim 2.

12. An electric tool switch comprising:

the printed wiring board according to claim 3.

13. The printed wiring board according to claim 1, wherein vibration is transmitted to the connection part during operation of the printed wiring board.

* * * * *